United States Patent
Suryanarayana et al.

(10) Patent No.: US 11,196,418 B1
(45) Date of Patent: Dec. 7, 2021

(54) CALIBRATION OF TRANSMITTER OUTPUT IMPEDANCE AND RECEIVER TERMINATION IMPEDANCE USING A SINGLE REFERENCE PIN

(71) Applicant: Xilinx, Inc., San Jose, CA (US)

(72) Inventors: Samudyatha Suryanarayana, Sunnyvale, CA (US); Vinit Shah, Los Gatos, CA (US); David S. Smith, Redwood City, CA (US); Andrew Tabalujan, Milpitas, CA (US); Arvind R. Bomdica, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/842,610

(22) Filed: Apr. 7, 2020

(51) Int. Cl.
*H03K 19/00* (2006.01)
*G11C 11/4093* (2006.01)
*H04L 25/02* (2006.01)

(52) U.S. Cl.
CPC ...... *H03K 19/0005* (2013.01); *G11C 11/4093* (2013.01); *H04L 25/0278* (2013.01)

(58) Field of Classification Search
CPC ............ H03K 19/0005; H04L 25/0278; G11C 11/4093
USPC .......................................................... 326/30
See application file for complete search history.

(56) References Cited

U.S. PATENT DOCUMENTS

| | | | |
|---|---|---|---|
| 8,384,424 B2 * | 2/2013 | Cho | H03K 19/017581 326/30 |
| 8,570,064 B1 | 10/2013 | Chan et al. | |
| 9,680,469 B1 | 6/2017 | Tan et al. | |
| 10,063,232 B1 | 8/2018 | Tan et al. | |
| 2004/0044808 A1 | 3/2004 | Salmon et al. | |
| 2005/0052200 A1 * | 3/2005 | Nguyen | H03K 19/0005 326/30 |
| 2006/0158198 A1 * | 7/2006 | Fujisawa | G11C 29/02 324/601 |
| 2011/0163778 A1 | 7/2011 | Moon | |

(Continued)

OTHER PUBLICATIONS

Micron, TN-41-02: DDR3 ZQ Calibration Introduction, Technical Note, published on 2008, retrieved online from <https://www.micron.com › documents › products › technical-note › dram> on Dec. 2019, 5 pages.

(Continued)

*Primary Examiner* — Don P Le
(74) *Attorney, Agent, or Firm* — Patterson + Sheridan, LLP

(57) ABSTRACT

Apparatus and associated methods relate to an I/O bank impedance calibration circuit having (a) a replica master resistor coupled to an external precision resistor, and (b) a control circuit configured to calibrate an output impedance of the master resistor to generate a calibrated code to control a replica slave resistor in each bank. In an illustrative example, a signal applied to the replica master resistor may be compared against a programmable reference signal. The control circuit may generate the calibrated code, in response to the comparison result, to calibrate the output impedance of the replica master resistor. By implementing the replica master resistor and the replica slave resistor, impedances of a large number of IOs or banks may be calibrated by the impedance calibration circuit using a single one reference pin.

20 Claims, 9 Drawing Sheets

(56) References Cited

U.S. PATENT DOCUMENTS

| | | | |
|---|---|---|---|
| 2013/0278286 A1* | 10/2013 | Matano | H03K 19/017545 |
| | | | 326/30 |
| 2015/0022282 A1* | 1/2015 | Kaneko | H03H 11/28 |
| | | | 333/103 |
| 2015/0131395 A1* | 5/2015 | Ishikawa | G11C 11/406 |
| | | | 365/222 |
| 2017/0331476 A1* | 11/2017 | Cho | G11C 5/147 |
| 2018/0041232 A1 | 2/2018 | Lim et al. | |
| 2019/0052268 A1* | 2/2019 | Lee | G11C 7/1057 |
| 2019/0334505 A1* | 10/2019 | Gans | H03H 11/28 |

OTHER PUBLICATIONS

Xilinx, Inc., Interfacing 7 Series FPGAs High-Performance I/O Banks with 2.5V and 3.3V I/O Standards, XAPP520 (v1.0), published on Dec. 13, 2011, 1-12 pp., San Jose, CA USA.

* cited by examiner

CALIBRATION OF TRANSMITTER OUTPUT IMPEDANCE AND RECEIVER TERMINATION IMPEDANCE USING A SINGLE REFERENCE PIN

TECHNICAL FIELD

Various embodiments relate generally to calibration circuits.

BACKGROUND

Modern networks are responsible for interconnecting computing devices operable to exchange data. Data may be exchanged from circuit to circuit on a common circuit board or from circuit board to circuit board along a common backplane, for example, in a computer or server. In some implementations, data may be exchanged over long distances, for example, from a travel agent's computer to an airline server on a cloud network. Modern networks may employ a number of mediums including physical wires, radio frequency (RF) channels, or fiber optics. Data exchanged between computing devices may include data packets having multiple bits.

When high-speed digital data is exchanged using differential pairs, the link between a transmitter and a receiver may form a transmission line. High-speed transmission lines may be characterized for their characteristic impedance. Reflections within the transmission line may be minimized when signals traveling a length of transmission line experience a substantially continuous characteristic impedance. Termination resistors may be employed at the ends of various transmission lines to provide impedance continuity. Minimizing reflections may increase signal integrity of data traveling on a transmission line, which may advantageously decrease bit error rate, and may permit increases in transmission distance and/or transmission speed.

SUMMARY

Apparatus and associated methods relate to an I/O bank impedance calibration circuit having (a) a replica master resistor coupled to an external precision resistor, and (b) a control circuit configured to calibrate an output impedance of the master resistor to generate a calibrated code to control a replica slave resistor in each bank. In an illustrative example, a signal applied to the replica master resistor may be compared against a programmable reference signal. The control circuit may generate the calibrated code, in response to the comparison result, to calibrate the output impedance of the replica master resistor. By implementing the replica master resistor and the replica slave resistor, impedances of a large number of IOs or banks may be calibrated by the impedance calibration circuit using a single one reference pin.

Various embodiments may achieve one or more advantages. For example, some embodiments may provide the impedance calibration circuit such that all banks, irrespective of different power supplies (e.g., banks in various voltage domains), may be calibrated with the master resistor. In some embodiments, the master resistor may include, for example, a tunable n-bit poly resistor connected with a transistor. The ratio of the poly resistor may be predetermined such that supply dependency may be not significant to the overall impedance of the master resistor.

In some embodiments, by implementing the replica master resistor and replica slave resistors, additional pins of a chip may be dedicated as, for example, power pins to improve the power integrity. In some embodiments, the extra pins may be removed to advantageously reduce the footprint of the package. In some embodiments, calibrated codes generated by the impedance calibration circuit may be scaled to, for example, cancel or reduce parasitic resistances. In some embodiments, the calibration may be performed continuously such that a change (e.g., temperature, voltage) of the chip may be dynamically adjusted in real time. In some embodiments, the impedance of the driver in the bank may be calibrated based on two programmable reference voltages. The two programmable reference voltages may be programmed to, for example, support multiple IO standards per bank. For example, 0.5*VCCO may be used for SSTL standards, 0.8*VCCO may be used for POD standards, and 0.2*VCCO may be used to support LVSTIL 11 standards.

In an exemplary aspect, an impedance calibration system (for an input/output circuit includes (a) a master resistance that coupled to an input node configured to adjust its resistance value in response to a feedback signal, (b) an input port adapted to connect the input node to an input signal from an external precision resistor, (c) a control circuit adapted to (c1) generate the feedback signal based on a comparison of the input signal to a predetermined threshold signal, and (c2) generate a calibration code corresponding to the feedback signal; and, (d) an impedance calibration circuit having a slave resistance coupled to receive the generated calibration code, wherein the slave resistance is configured as a replica of the master resistance, and the slave resistance determines an impedance of the at least one driver in the impedance calibration circuit.

In some embodiments, the master resistance may include an on-die pull-down resistor. In some embodiments, the on-die pull-down resistor may include a plurality of on-die pull-down resistors connected in parallel. In some embodiments, each sub on-die pull-down resistor may include a poly resistor coupled to a drain terminal of a transistor. In some embodiments, the poly resistor may include a tunable n-bit poly resistor. In some embodiments, the control circuit may include a first comparator configured to compare a voltage at the input node with the predetermined threshold signal to generate a first comparison result and a first state machine configured to generate an initial first signal to the third terminal and update the initial first signal, in response to the first comparison result, to calibrate an impedance of the master resistance according to the external precision resistor.

In some embodiments, first state machine may be configured to start a calibration cycle by modulating an n-bit code of the master resistor and looking for a step change on the first comparison result. In some embodiments, first state machine may be configured to conduct for a predetermined number of iterations and generate an average of the predetermined number of iterations to obtain the feedback signal. In some embodiments, first state machine may be further configured to scale the generated calibration code with a predetermined coefficient.

In some embodiments, the system may further include a plurality of N input/output banks, each input/output bank of the plurality of N input/output banks may include a first circuit, the first circuit may include the slave resistance configured to receive the generated calibration code, a first driver, having a first pull-up circuit coupled to a first pull-down circuit through a first intermediate node, the first intermediate node is further coupled to the slave resistance, a second comparator configured to compare a voltage at the first intermediate node with a second programmable reference voltage to generate a second comparison result, and, a second state machine configured to generate an initial second signal to the first pull-up circuit, and update the initial second signal, in response to the second comparison result, to calibrate an impedance of the first pull-up circuit according to the calibrated slave resistance.

In some embodiments, each input/output bank of the plurality of N input/output banks may further include a second circuit, and the second circuit may include a second driver, having a second pull-up circuit coupled to a second pull-down circuit through a second intermediate node, the second pull-up circuit may be configured to receive the updated second signal, and, a second comparator configured to compare a voltage at the second intermediate node with a third programmable reference voltage to generate a third comparison result, the second state machine may be further configured to generate an initial third signal to the second pull-down circuit, and update the initial third signal, in response to the third comparison result, to calibrate an impedance of the second pull-down circuit against the calibrated impedance of the first pull-up circuit.

In some embodiments, the second state machine may be further configured to turn off the first pull-down circuit during the second calibration. In some embodiments, the first predetermined voltage level may include circuit ground. In some embodiments, each of the first driver and the second driver may be a replica of a driver in a transmission circuit. In some embodiments, each of the first driver and the second driver may be a replica of a driver in a receiving circuit.

In another exemplary aspect, a method of implementing an impedance calibration system for an input/output circuit includes (a) providing a master resistance and coupling the master resistance to an input node configured to adjust its resistance value in response to a feedback signal, (b) adapting an input port to connect the input node to an input signal from an external precision resistor, (c) providing a control circuit and configuring the control circuit to (c1) generate the feedback signal based on a comparison of the input signal to a predetermined threshold signal, and (c2) generate a calibration code corresponding to the feedback signal, and, (d) providing an impedance calibration circuit having a slave resistance, and coupling the slave resistance to receive the generated calibration code and determine an impedance of the at least one driver in the impedance calibration circuit, wherein the slave resistance is configured as a replica of the master resistance.

In some embodiments, the master resistance may include a plurality of on-die pull-down resistors connected in parallel. In some embodiments, each sub on-die pull-down resistor may include a poly resistor coupled to a drain terminal of a transistor. In some embodiments, the poly resistor may include a tunable n-bit poly resistor. In some embodiments, the method may include providing a plurality of N input/output banks and configuring each input/output bank of the plurality of N input/output banks to have a first circuit. Configuring each input/output bank may include providing the slave resistance to receive the updated first signal, providing a first driver having a first pull-up circuit coupled to a first pull-down circuit through a first intermediate node, coupling the first intermediate node to the copy of the second resistor, providing a comparator to compare a voltage at the first intermediate node with a second programmable reference voltage to generate a comparison result, configuring a state machine to generate an initial second signal to the first pull-up circuit, and, further configuring the state machine to update the initial second signal, in response to the comparison result, to calibrate an impedance of the first pull-up circuit against the calibrated slave resistance.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to an I/O bank impedance calibration circuit having (a) a replica master resistor coupled to an external precision resistor, and (b) a control circuit configured to calibrate an output impedance of the master resistor to generate a calibrated code to control a replica slave resistor in each bank. In an illustrative example, a signal applied to the replica master resistor may be compared against a programmable reference signal. The control circuit may generate the calibrated code, in response to the comparison result, to calibrate the output impedance of the replica master resistor. By implementing the replica master resistor and the replica slave resistor, impedances of a large number of IOs or banks may be calibrated by the impedance calibration circuit using a single one reference pin.

To aid understanding, this document is organized as follows. First, an exemplary platform (e.g., FPGA) suitable to perform data communication is briefly introduced with reference to FIG. 1. Second, with reference to FIGS. 2A-3B, the discussion turns to architectures of an exemplary impedance calibration circuit used to calibrate transmitter output impedance and/or receiver termination impedance in a data commination system. With reference to FIG. 4, an exemplary architecture of a transmitter used in the data commination system is discussed. Then, with reference to FIG. 5-6, the discussion discloses exemplary methods to implement the impedance calibration circuit and perform impedance calibration. Finally, with reference to FIG. 7, another exemplary platform (e.g., SOC) that is suitable to perform the data communication and/or the impedance calibration is further discussed.

Figure 1:
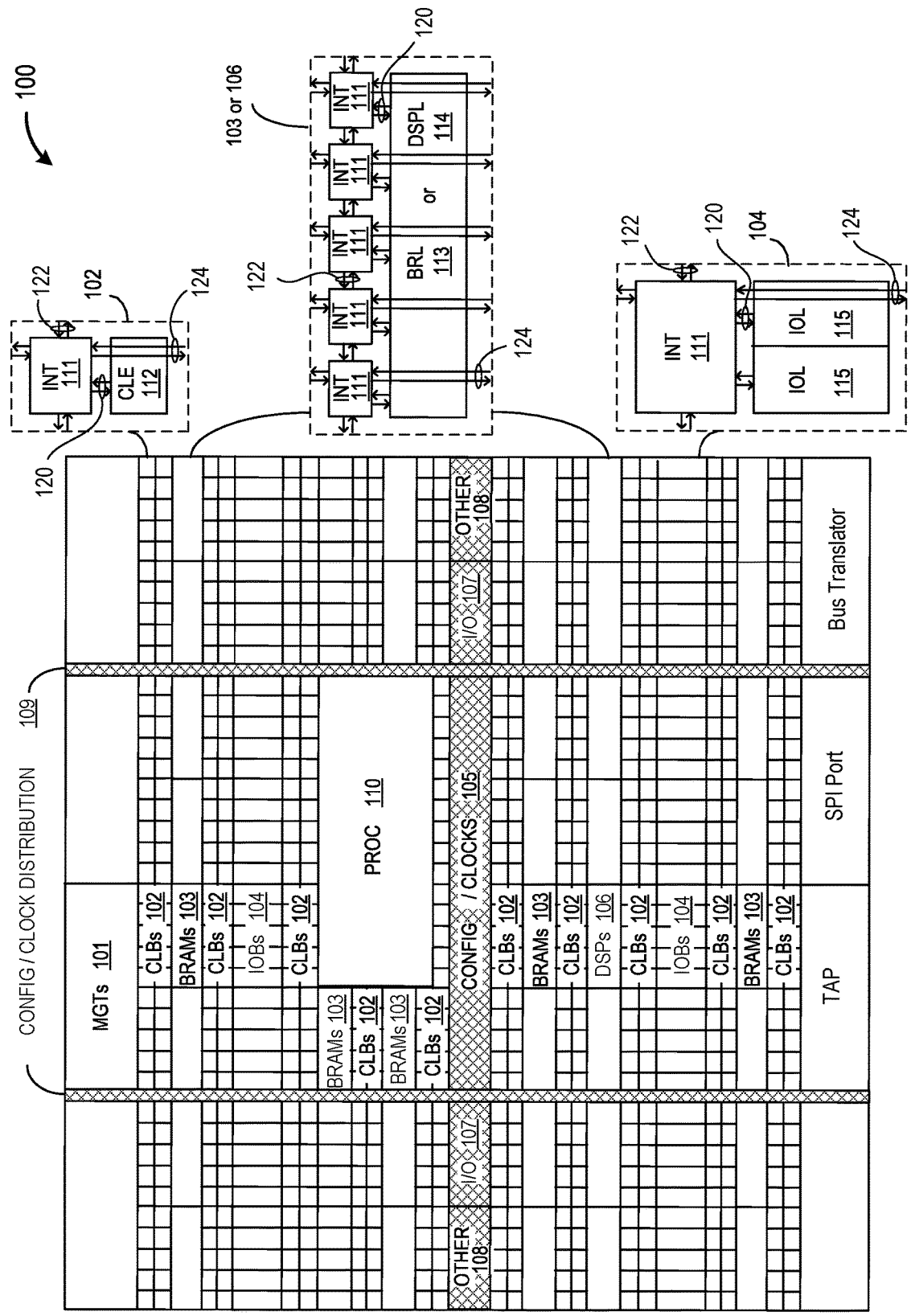
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (IO) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual IO bond pads connected, for example, to the IO logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

Input/outputs (IOs) may be used in various systems for data communication (e.g., Double Data Rate 4 (DDR4) interface). Data rates at circuit input and output pins have increased dramatically. These high data rates place strict requirements on signal integrity. Reflections due to impedance mismatches may be caused when a signal is received from a transmission line by a receiver having an impedance that does not match the impedance of the transmission line. This mismatch may prevent some of the energy of the signal from being absorbed by the receiver. This unabsorbed energy is reflected back to the signal source.

When a circuit (e.g., IOs) is used to both transmit and receive data, an input/output (IO) stage (e.g., driver) including a plurality of transistors can be configured to provide a series termination when transmitting and a parallel termination when receiving, thereby providing On-Chip Termination (OCT). The impedance provided by the IO stage may be adjusted by enabling or disabling individual transistors within the plurality of transistors. The impedance provided by the IO stage may be calibrated in order to match the impedance of the transmission line and in order to account for variations due to supply voltage, temperature, and other technological process factors. During calibration, the impedance can be adjusted to be substantially equal to a reference resistance.

Figure 2A:
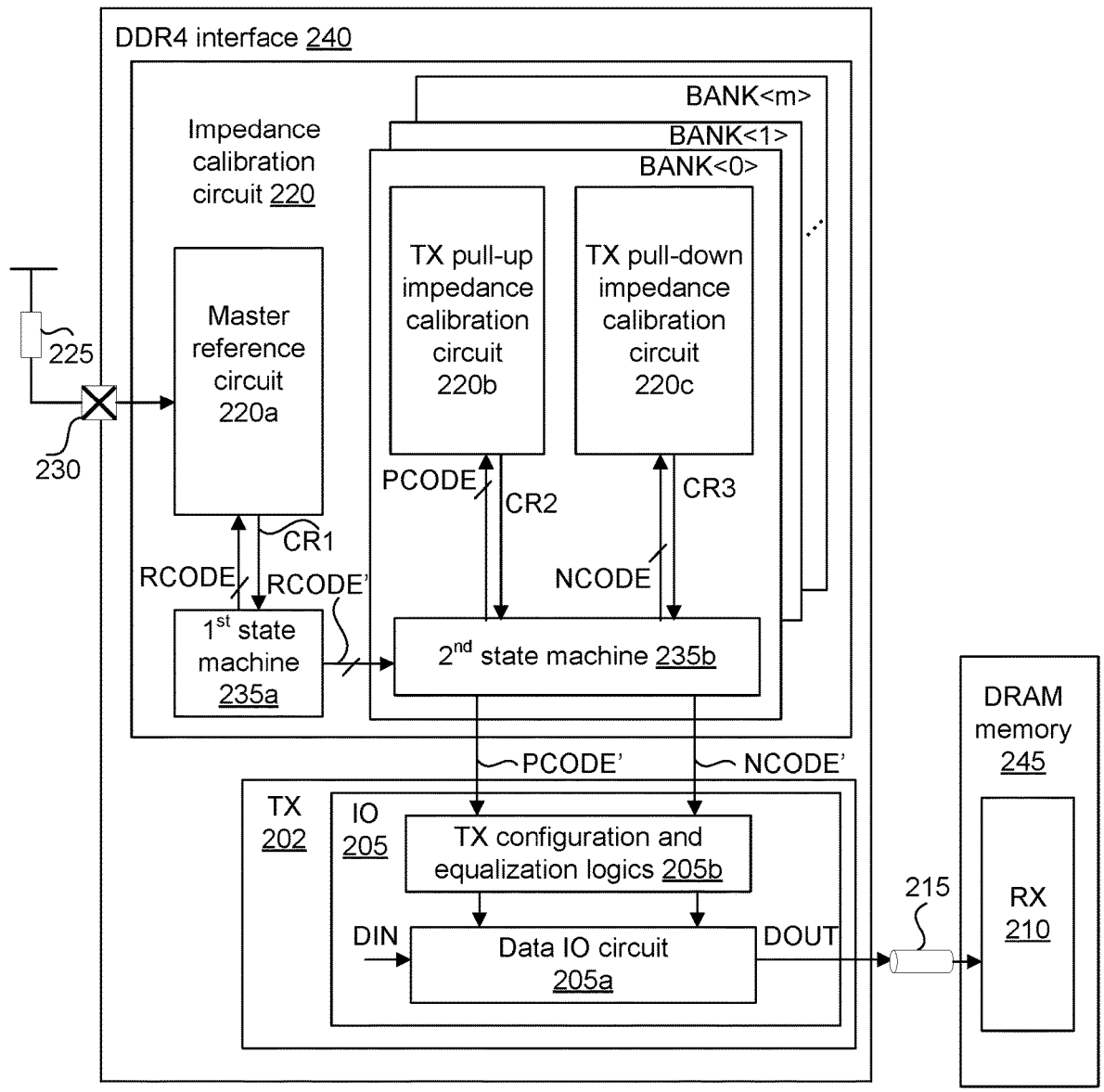
FIG. 2A depicts a block diagram of a double data rate (DDR) communication system having an exemplary impedance calibration circuit configured to calibrate a transmitter's output impedance.

FIG. 2A depicts a block diagram of a double data rate (DDR) communication system having an exemplary impedance calibration circuit configured to calibrate a transmitter's output impedance. In this depicted example, a double data rate (DDR) communication system 200A includes a transmitter (TX) 202 coupled to a receiver 210 over transmission medium 215. The transmitter 202 also includes an input/output driver (IO) 205. The IO includes a data input/out (IO) circuit 205a configured to receive an incoming data signal DIN and generate an output data signal DOUT. The data input/out (IO) circuit 205a may be controlled to select some of a plurality of resistances (not shown) provided therein and vary the impedance of the selected resistances in response to a calibrated pull-up code signal PCODE' (e.g., an N-bit signal, where N is a positive integer) and a calibrated pull-down code signal NCODE' (e.g., an N-bit signal) generated by an impedance calibration circuit 220. The impedance calibration circuit 220 includes a master reference circuit 220a coupled to an external precision resistor 225 through a pin 230. The master reference circuit 220a may be coupled to a first state machine 235a to form a closed loop. The first state machine 235a calibrates the master reference circuit 220a and generates a calibrated reference code signal RCODE'. RCODE' may be then used by each bank (e.g., BANK<0>, . . . BANK<m>) to generate the corresponding PCODE' and NCODE'. By using the impedance calibration circuit 220, only one reference pin may be used by the impedance calibration circuit 220 even many IOs or many banks are supported in a chip. Also, all banks irrespective of different power supplies (e.g., banks in various voltage domains) may be calibrated with the resistor 225 through the master reference circuit 220a. Accordingly, extra pins of the chip may be dedicated as, for example, power pins to improve the power integrity. In some embodiments, the extra pins may be removed to advantageously reduce the area consumption of the package.

The impedance calibration circuit 220 calibrates an output impedance of the data IO circuit 205a against the external precision resistor 225 connected to the outside of the transmitter 202 and provides code signals having the calibrated information (e.g., PCODE' and NCODE') to the data input/output (IO) circuit 205a. More specifically, the impedance calibration circuit 220 also includes a number of banks (e.g., BANK<0>, . . . BANK<m>). Each bank includes a TX pull-up impedance calibration circuit 220b, a TX pull-down impedance calibration circuit 220b, and a second state machine 235b. RCODE' is sent to the second state machine 235b in each bank. The second state machine 235b may then control the calibration of the TX pull-up impedance calibration circuit 220b in each bank to generate the PCODE'.

The PCODE' is then applied to a corresponding TX pull-down impedance calibration circuit 220c in each bank, and the second state machine 235b may then control the calibration of the TX pull-down impedance calibration circuit 220c to generate the NCODE'. Then, the driving level of the data IO circuit 205a may be adjusted using the PCODE' and NCODE'. Thus, the impedance corresponding to the output data DOUT may be calibrated so as to be equal to a target impedance (e.g., 40 ohm). Accordingly, impedance matching with an external device that interfaces data is thereby achieved.

The impedance calibration circuit 220 may further calibrate an on die termination (ODT) value in response to, for example, process, voltage, and temperature (PVT) variation. An exemplary architecture of the impedance calibration circuit 220 will be discussed in further detail with reference to FIGS. 2B-3B. In some embodiments, the impedance calibration circuit 220 may be coupled to the transmitter in each of a number of IO circuits (e.g., the impedance calibration circuit 220 is shared by a group of IO circuits).

In this depicted example, the IO 205 is part of a DDR4 interface 240. The IO 205 also includes a TX configuration and equalization logics 205b used to configure the data input/out (IO) circuit 205a in response to the PCODE' and NCODE'. An exemplary architecture of transmitter 202 will be discussed in further detail with reference to FIG. 4. The receiver 210 is part of a DRAM memory 245. The transmission medium 215 includes an electrical path between the transmitter 202 and the receiver 210 and may include, for example, printed circuit board (PCB) traces, vias, cables, connectors, decoupling capacitors, and the like. The receiver of the DDR4 interface 240, and the transmitter of the DRAM memory 245, are omitted for clarity. In some examples, the DDR4 interface 240 may be disposed in an integrated circuit (IC) (not shown), and the DDR4 interface 245 may be disposed in another IC (not shown).

While the DDR4 interface 240 and the DRAM memory 245 are shown, in other examples, each of the transmitter 202 and/or the receiver 210 can be a stand-alone circuit not being part of a larger transceiver circuit. In some examples, the transmitter 202 and the receiver 210 can be part of one or more integrated circuits (ICs), such as application specific integrated circuits (ASICs) or programmable ICs, such as field programmable gate arrays (FPGAs).

In some embodiments, the transmitter 202 may generate a serial data signal from a parallel data path (serialization). The serial data signal has a particular data rate (symbol rate). In some examples, data bytes from the parallel data path may be encoded prior to serialization. The transmitter 202 may drive the serial data signal onto the transmission medium 215 using a digital modulation technique, such as binary non-return-to-zero (NRZ) pulse amplitude modulation (PAM). The transmission medium 215 may propagate electrical signal(s) representing symbols of the serial data signal (e.g., logic "1" and logic "0") towards the receiver 210. In some embodiments, the transmitter 202 may configured to equalize the serial data signal prior to transmission over the transmission medium 215. A finite impulse response (FIR) filter may be used to mitigate inter-symbol interference (ISI) caused by the transmission medium 215.

Figure 2B:
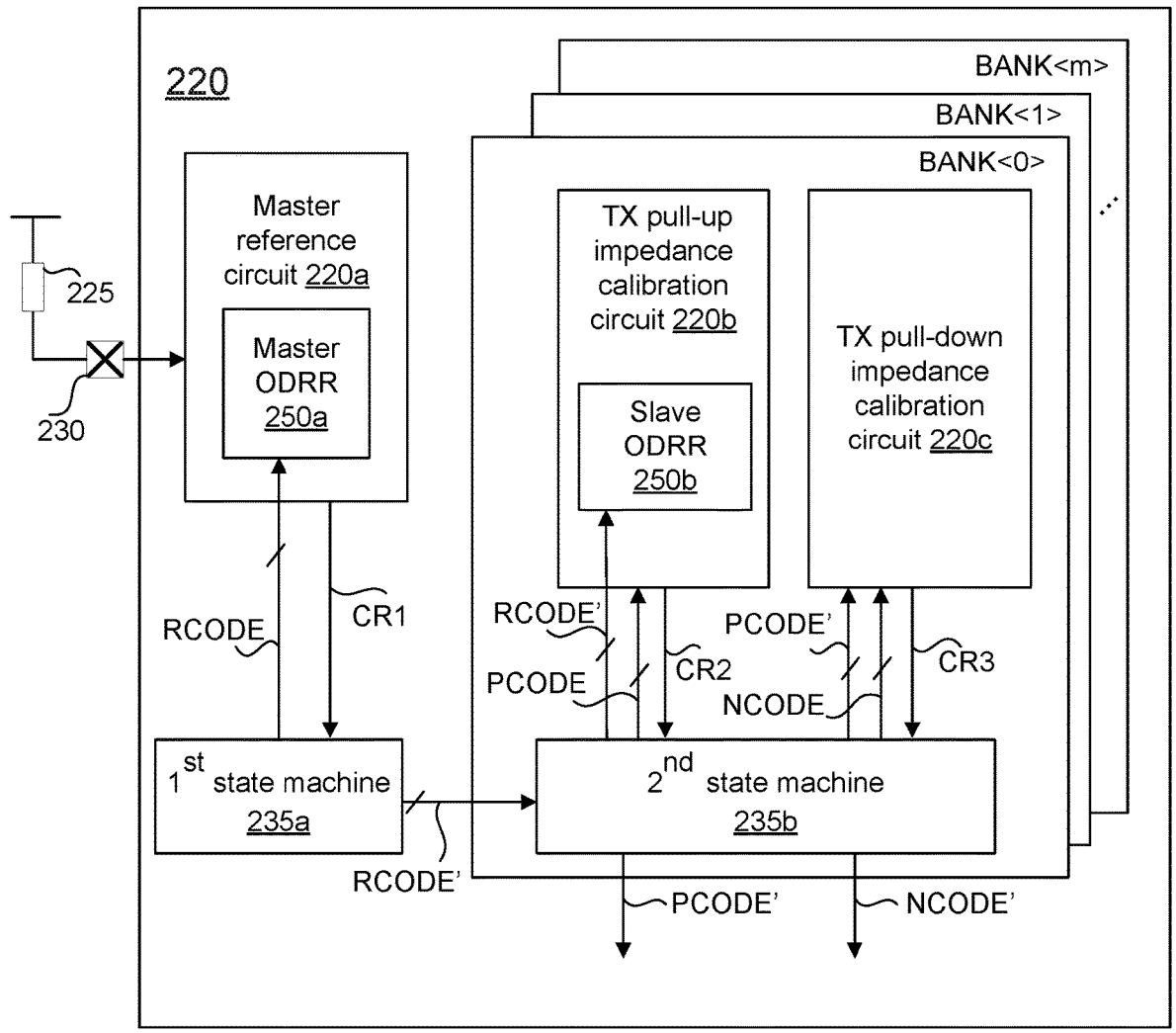
FIG. 2B depicts a block diagram of the exemplary impedance calibration circuit with a master on-die reference resistor and a slave on-die reference resistor.

FIG. 2B depicts a block diagram of the exemplary impedance calibration circuit with a master on-die reference resistor and a slave on-die reference resistor. In this depicted example, the master reference circuit 220a includes a master on-die reference resistor (ODRR) 250a, and the TX pull-up impedance calibration circuit 220b in each bank (e.g., BANK<0>) includes a slave ODRR 250b which is a replica of the master ODRR 250a. The slave ODRR 250b may be coupled to a driver in the TX pull-up impedance calibration circuit 220b. An exemplary architecture of the master reference circuit with a mater ODRR will be discussed in further detail with reference to FIG. 3A.

The first state machine 235a is configured to provide the initial reference signal RCODE to the master ODRR 250a. The master ODRR 250a is then calibrated to the external precision resistor 225. The corresponding RCODE' used to achieve the calibrated ODRR 250a is then sent to the second state machine 235b in each bank. The second state machine 235b in each bank then sends the RCODE' to slave ODRRs (e.g., the slave ODRR 250b) in the corresponding bank and sends an initial PCODE to a first pull-up circuit (not shown) in the TX pull-up impedance calibration circuit 220b. The master and slave ODRRs may be designed to be quite linear across their operating ranges such that the different power supplies (e.g., difference VCCOs) across different banks (e.g., BANK<0>, . . . BAND<m>) may have minimal impact to the overall impedance.

The first pull-up circuit is then calibrated in response to the RCODE'. The corresponding PCODE' used to achieve the first pull-up circuit is then sent to the second state machine 235b in each bank. The second state machine 235b in the bank may be control the calibration of the TX pull-down impedance calibration circuit 220c to generate the NCODE'. An exemplary architecture of the TX pull-up impedance calibration circuit 220b and TX pull-down impedance calibration circuit 220c will be discussed in further detail with reference to FIG. 3B. By implementing the master ODRR 250a in the master reference circuit 220a and implementing the slave ODRR 250b in each bank, only one reference pin may be used by the impedance calibration circuit 220 even many IOs or many banks are supported in a chip. Also, all banks irrespective of different power supplies (e.g., banks in various voltage domains) may be calibrated with the master ODRR 250a.

Figure 3A:
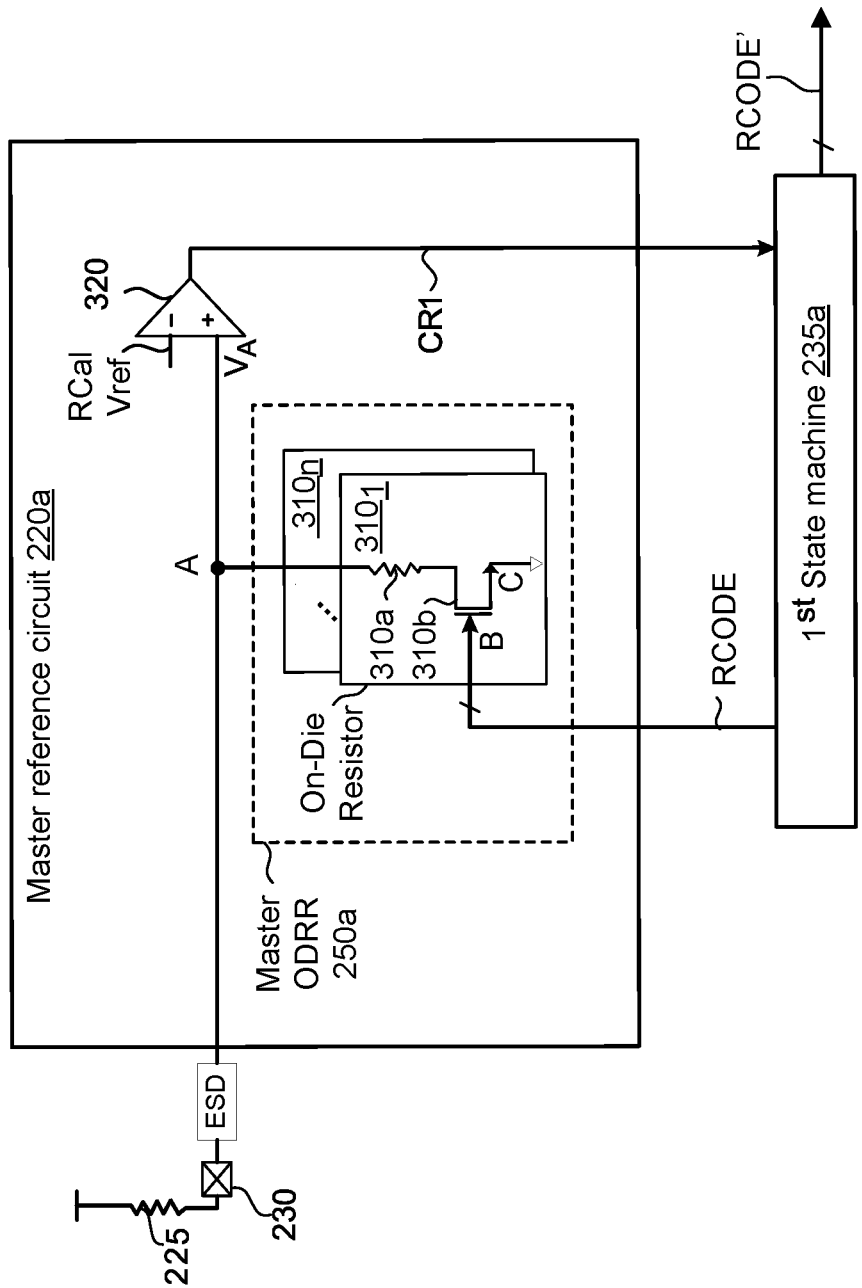
FIG. 3A depicts a schematic diagram of an exemplary master reference circuit having the master on-die reference resistor.
Figure 4:
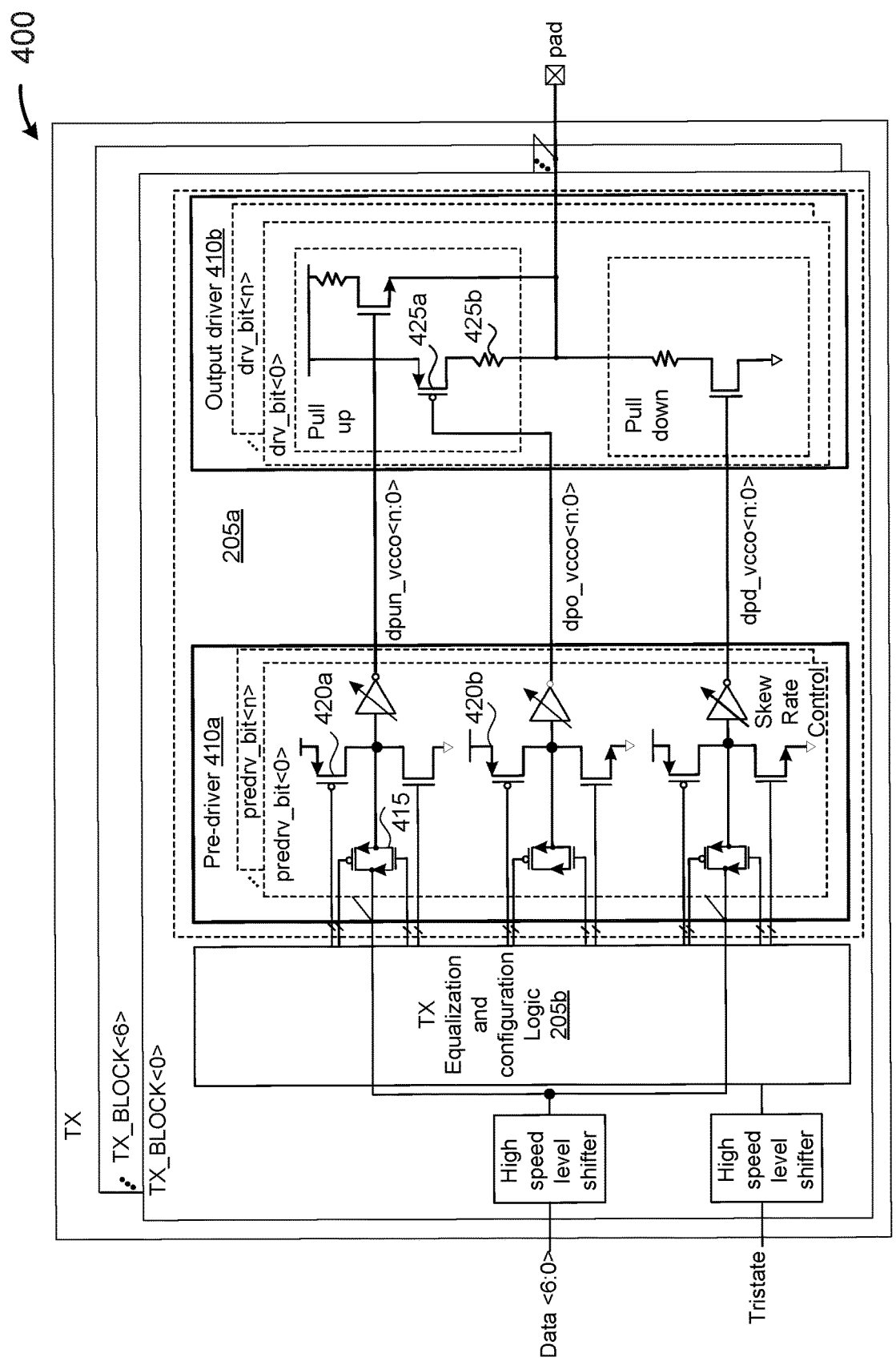
FIG. 4 depicts a schematic diagram of an exemplary transmitter implemented in the communication system.

FIG. 3A depicts a schematic diagram of an exemplary master reference circuit having the master on-die reference resistor. In this depicted example, the master reference circuit 220a includes the master ODRR 250a which is calibrated to the external precision reference resistor 225 through the pin 230. The master ODRR 250a includes a number of sub-ODRRs $310_1$-$310_n$ coupled in parallel.

Each sub-ODRR $310_1$-$310_n$ includes an on-die resistor pull-down 310a having one terminal coupled to a drain terminal of a power switch (e.g., transistor) 310b. The other terminal of the on-die resistor 310a is coupled to the pin 250 through a first node A. In some embodiments, the on-die resistor 310a may be a tunable N-bit (e.g., 7-bit) poly resistor. Resistance ratio of the on-die resistor 310a to the transistor 310b may be, for example, 99.4% such that supply dependency is not significant to the overall impedance of the on-die pull-down resistors $310_1$-$310_n$. In this depicted example, the power switch 310b is an N-type metal-oxide-semiconductor field-effect-transistor (NMOSFET). The gate terminal (e.g., terminal B) of the MOSFET 310b is configured to receive the initial RCODE from the first state machine 235a to adjust a corresponding impedance of each sub-ODRR in the master ODRR 250a. The source terminal (e.g., terminal C) of the NMOSFET is coupled to a predetermined voltage level (e.g., a low impedance voltage level including ground). In some embodiments, the power switches may be FinFETs. By calibrating the master ODRR 250a against the external precision resistor 225 and using the calibrated RCODE' for all banks, the banks irrespective of different power supplies (e.g., banks in various voltage domains) may be calibrated while only one reference pin is used.

Division of the voltage (e.g., $V_A$) between the external precision resistor 225 and the master ODRR 250a is compared against a first programmable calibration reference voltage Vref_Rcal by a first comparator 320 continuously. The first comparator 320 generates a first comparison result CR1 and forwards first comparison result CR1 to the first state machine 315. The first state machine 315 then starts the calibration cycle by modulating (e.g., stepping), for example, the 7-bit code (in increment of 1) of the on-die pull-down resistors 310 to look for a step change of the first comparison result CR1. The calibration may be conducted for, for example, 8 iterations and an average of these conducted iterations may be used to generate the calibrated RCODE. An exemplary method to perform the on-die pull-down resistor calibration will be discussed in further detail with reference to FIG. 6.

In some embodiments, inputs of the first comparator 320 may be switched every iteration to cancel or reduce comparator input offset. In some embodiments, the RCODE' may be scaled to, for example, compensate for parasitic resistances. The scaling may be a function of binary weighted multiplication of the RCODE' with the capability to add static offset for a value between −8 and +7. The scaled RCODE' may be then continuously forwarded to all calibration blocks (e.g., TX configuration and equalization logics 205b) which reside in the banks.

Figure 3B:
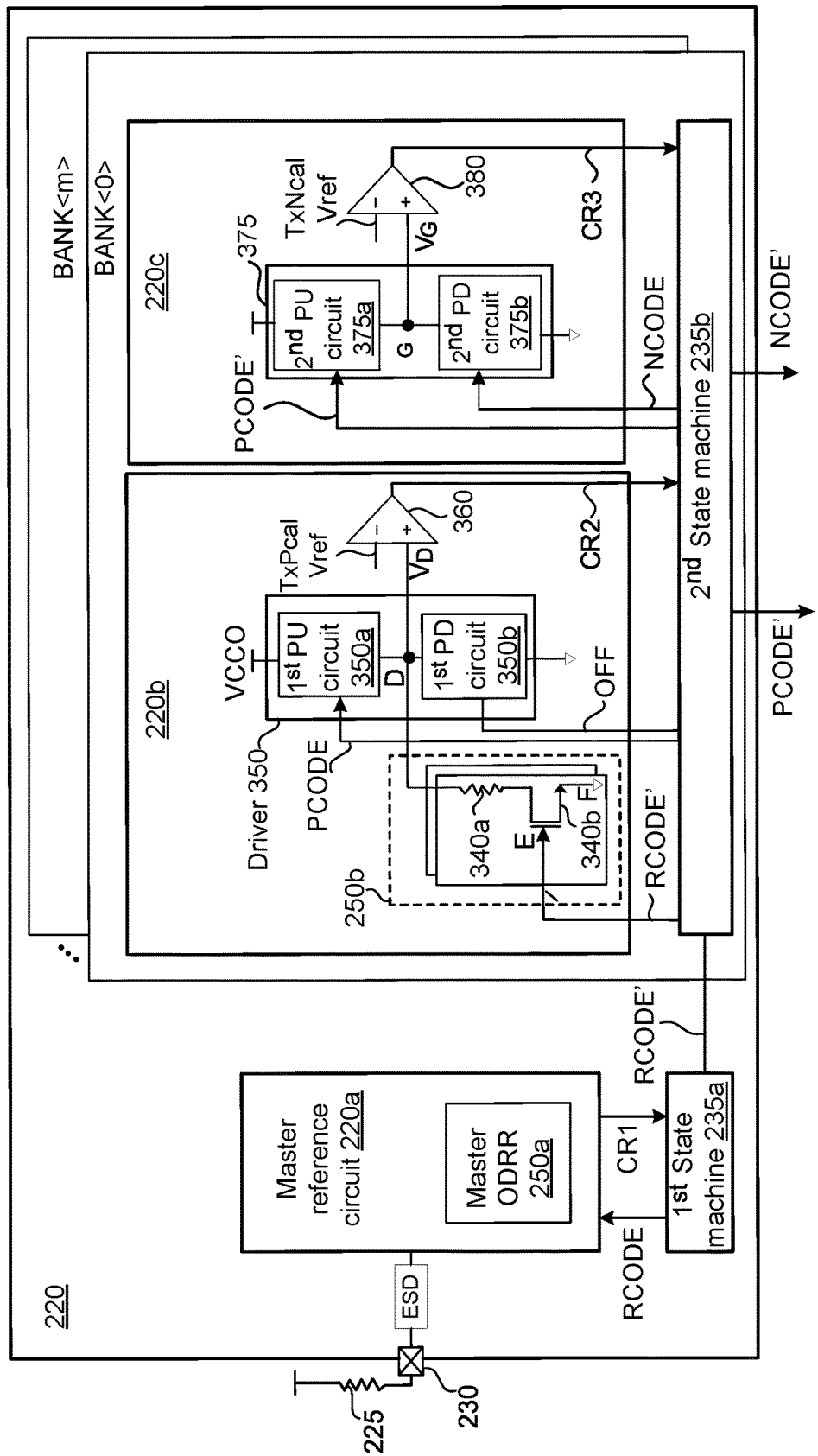
FIG. 3B depicts a schematic diagram of the exemplary impedance calibration circuit having the master on-die reference resistor and the slave on-die reference resistor.

FIG. 3B depicts a schematic diagram of the exemplary impedance calibration circuit having the master on-die reference resistor and the slave on-die reference resistor. In this depicted example, the impedance calibration circuit 220 includes a number of input/output banks (e.g., BANK<0>, . . . BANK<m>). Each input/output bank (e.g., BANK<0>) includes a TX pull-up impedance calibration circuit 220b configured to perform TX pull-up impedance calibration, a TX pull-down impedance calibration circuit 220c configured to perform TX pull-down impedance calibration and a second state machine 235b configured to control the TX impedance calibration in the bank.

The TX pull-up impedance calibration circuit 220b includes a copy of the master ODRR (e.g., slave ODRR 250b) which gets RCODE' from the master ODRR 250a. Each sub-ODRR of the slave ODRR 250b includes an on-die resistor 340a coupled to a drain terminal of a power switch 340b. The other terminal of the on-die resistor 340a is connected to a first intermediate node D. RCODE' may be then synchronized in the slave ODRR 250b (e.g., received by each gate terminal E of each of the power switch 340b) and updated glitchlessly with one shot pulse. The source terminal F of the power switch 340b is also coupled to a predetermined voltage level (e.g., low impedance voltage level).

The TX pull-up impedance calibration circuit 220b also includes a first replica of the actual transmitter (e.g., the circuit 205a). More specifically, in this depicted example, the TX pull-up impedance calibration circuit 220b includes a first driver 350 coupled to a power supply $V_{CCO}$. The first driver 350 includes a first pull-up circuit 350a coupled to a first pull-down circuit 350b through the first intermediate node D. The second state machine 235b is further configured to generate an initial PCODE to be received by the first pull-up circuit 350a in the bank. The first pull-down circuit 350b may be turned off during the calibration of the first pull-up circuit 350a.

The voltage at the first intermediate node D is compared against a second programmable calibration reference voltage Vref_TxPcal by a second comparator 360 continuously. A second comparison result CR2 generated by the second comparator 360 is forwarded to the second state machine 235b. The TX pull-down impedance is then calibrated against the slave ODRR 250b. When the TX pull-down impedance calibration is done, the calibrated code signal PCODE' may be then forwarded to the TX pull-down impedance calibration circuit 220c.

In this depicted example, the TX pull-down impedance calibration circuit 220c also includes a second replica of the actual transmitter (e.g., the circuit 205a). More specifically, in this depicted example, the TX pull-down impedance calibration circuit 220c includes a second driver 375 coupled to the power supply $V_{CCO}$. The second driver 375 includes a second pull-up circuit 375a coupled to a second pull-down circuit 375b through a second intermediate node G. The second state machine 235b is further configured to generate an initial code signal NCODE to be received by the second pull-down circuit 375b. The second pull-up circuit 375a receives the calibrated code signal PCODE'.

The voltage at the second intermediate node G is then compared against a third programmable calibration reference voltage Vref_TxNcal by a third comparator 380 continuously. A third comparison result CR3 generated by the third comparator 380 is forwarded to the second state machine 235b. The TX pull-down impedance is then calibrated based on PCODE' and NCODE. The second programmable calibration reference voltage Vref_TxPcal and the third programmable calibration reference voltage Vref_TxNcal may be programmed to support multiple IO standards per bank. For example, 0.5*VCCO may be used for SSTL standards, and 0.8*VCCO may be used for POD standards.

When the TX pull-down impedance calibration is done in the TX pull-down impedance calibration circuit 220c, the calibrated code signal PCODE' and the calibrated code signal NCODE' (and the corresponding programmable calibration reference voltages) may be then sent by the second state machine 235b to all the TX configuration and equalization logics (e.g., logics 205b) within a bank. Each TX configuration and equalization logics in the bank may select the corresponding PCODE' and NCODE' based on the selected IO standard. Thus, each bank may be calibrated independently once the RCODE' is received from the master reference circuit 220a/the first state machine 235a. Instead of having a dedicated reference resistor pin in every bank, this impedance calibration circuit 220 provides a design to only use one reference resistor pin per device such that useable IO pin counts may be maximized.

In some embodiments, the impedance calibration circuit 220 may also include an electrostatic discharge (ESD) protection circuit, and the master reference circuit 220a may be coupled to the pin 250 through the ESD protection circuit. In some embodiments, the TX output impedance calibration may be performed at the start-up of the chip. In some embodiments, continuous calibrations may be performed by the impedance calibration circuit 220 to advantageously reduce or cancel any drastic changes (e.g., PVT change) after the start-up of the chip. For example, the first state machine 235a may be further configured to monitor the change (e.g., current, voltage, frequency, temperature) such that the RCODE' may be updated accordingly.

FIG. 4 depicts a schematic diagram of an exemplary transmitter implemented in the communication system. In this depicted example, an exemplary transmitter (TX) 400 (e.g., the transmitter 202) includes seven TX_BLOCKs, and each TX_BLOCK may be calibrated to, for example, 240 ohm at the operating point of a selected IO standard through TX pull-up and pull-down impedance calibration. In this depicted example, the data and tristate signals from, for example, PHY, are combined and then level shifted to IO voltage domain (e.g., $V_{CCO}$).

In this depicted example, the transmitter 202 is configured to equalize the serial data signal (e.g., by the TX configuration and equalization logics 205b) prior to transmission over the transmission medium 215. The TX configuration and equalization logics 205b may also configure the TX drive strength based on the selected IO standard. The data IO circuit 205a may be configured as a push-pull driver or an N-over-N driver. In some embodiments, the N-over-N driver may be configured for low-power double data rate 4/X (LPDDR4/X) standard and the push-pull driver may be configured for the DDR4/5 standards. In some embodiments, a pair of TXs may be programmed to support differential standards, such as MIPI D-PHY, low voltage differential signaling (LVDS) and differential stub series terminated logic (SSTL) standards. In some embodiments, the TX may be programmed to support finite impulse response (FIR) equalization by partitioning the TX_BLOCKs to receive appropriately delayed and inverted data. In some embodiments, the data IO circuit 205a may be repurposed as a receiver (RX) ODT which may support multiple termination topologies, such as terminated to power, ground, and split terminations, for example.

In this depicted example, the data IO circuit 205a includes a pre-driver 410a and an output driver 410b coupled to the outputs of the pre-driver 410a. When in the ODT mode, the data path may be disabled through a transmission gate (e.g., transmission gate 415) in the pre-driver 410a. The pull-up or pull-down transistors (e.g., transistors 420a, 420b) in the pre-driver 410a may be configured based on desired termination topologies.

The output driver 410b, in this depicted example, includes binary-weighed pull-up and pull-down transistor legs. Each leg includes a transistor (e.g., transistor 425a) and a resistor (e.g., resistor 425b) coupled to the transistor in series. The resistance ratio of the resistor to the transistor in the same leg may be designed to meet strict TX linearity specifications. In some embodiments, the TX may also have slew rate control features configured to support both high speed terminated channels and low speed high load unterminated channels. In some implementations (e.g., in the Field Programmable Gate Array (FPGA) devices and/or devices with an adaptive compute acceleration platform (ACAP)), a number of (e.g., 54) input output blocks (IOB) may be grouped as a bank. Each bank may have its own power supply. By using the impedance calibration circuit, only one reference pin may be used to calibrate the TX pull-up and pull-down impedance irrespective of power domains of the banks.

Figure 5:
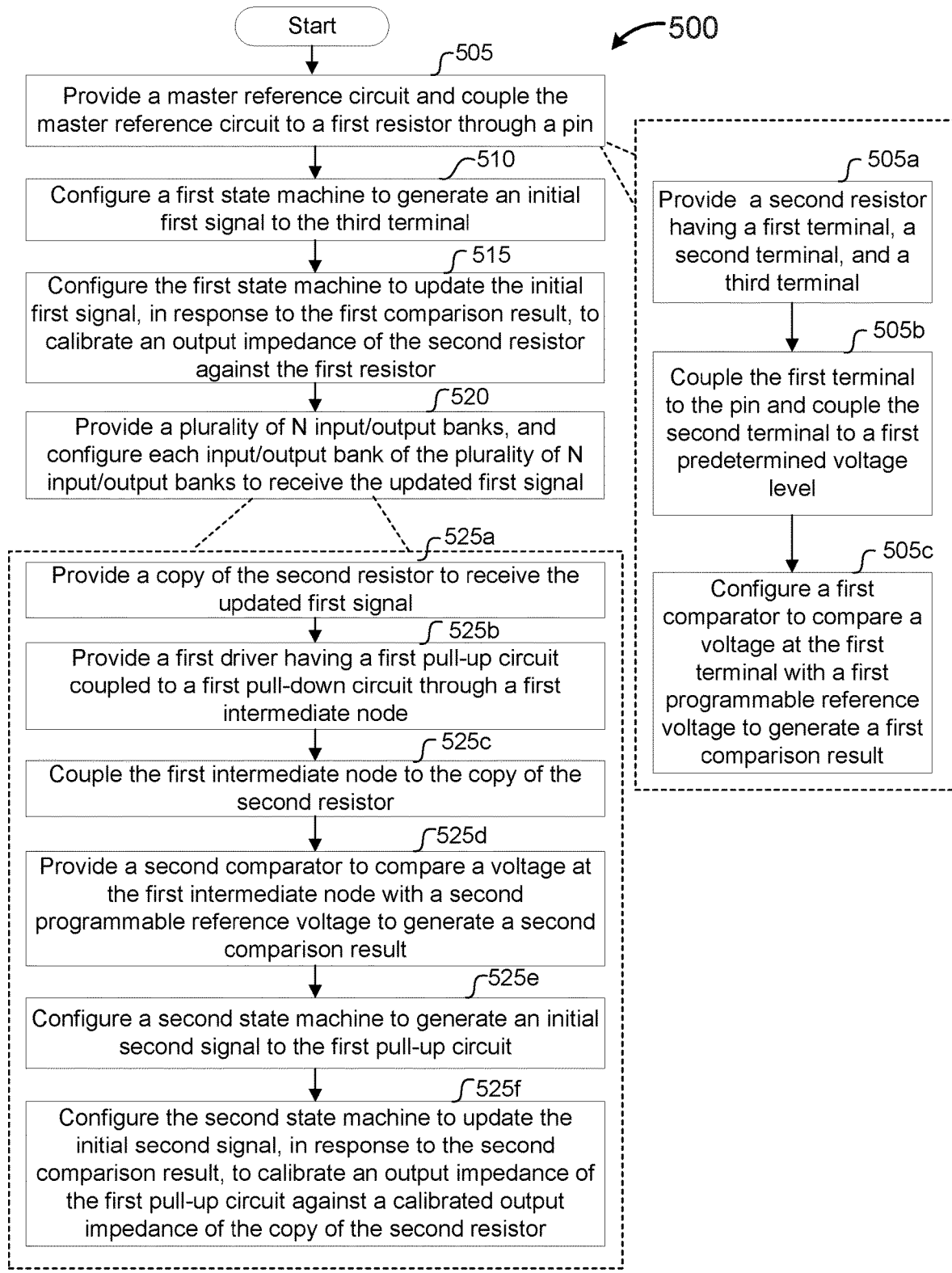
FIG. 5 depicts a flow chart of an exemplary method to implement the exemplary impedance calibration circuit.

FIG. 5 depicts a flow chart of an exemplary method to implement the exemplary impedance calibration circuit. An exemplary method 500 to implement the impedance calibration circuit 220 includes, at 505, providing a master reference circuit (e.g., the master reference circuit 220a) and coupling the master reference circuit 220a to a first resistor (e.g., the external precision resistor 225) through a pin (e.g., the pin 230). Providing the master reference circuit includes, 505a, providing a second resistor (e.g., the master ODRR 250a) having a first terminal (e.g., terminal A), a second terminal (e.g., terminal C), and a third terminal (e.g., terminal B). Providing the master reference circuit 220a also includes, 505b, coupling the first terminal (e.g., terminal A) to the pin 230 and coupling the second terminal C to a first predetermined voltage level (e.g., GND). Providing a master reference circuit also includes, 505c, configuring a first comparator (e.g., the first comparator 320) to compare a voltage (e.g., $V_A$) at the first terminal with a first programmable reference voltage (e.g., Vref_cal) to generate a first comparison result (e.g., CR1).

The exemplary method 500 also includes, at 510, configuring a first state machine (e.g., the first state machine 235a) to generate an initial first signal (e.g., RCODE) to the third terminal B. The exemplary method 500 also includes, at 515, further configuring the first state machine 235a to update the initial first signal RCODE, in response to the first comparison result CR1, to calibrate an output impedance of the second resistor (e.g., the master ODRR 250a) against the first resistor 225.

In some embodiments, the method 500 may also include, at 520, providing a plurality of N input/output banks, and configuring each input/output bank of the plurality of N input/output banks to have a slave resistor to receive the updated first signal. The updated first signal RCODE' is then sent to the slave resistor (e.g., the slave ODRR 250b) of the master ODRR 250a in each bank (e.g., BANK<0>, . . . BANK<m>) to calibrate an output impedance of a driver (e.g., the driver 350) in the bank.

In some embodiments, configuring each input/output bank may include, at 525a, providing a copy of the second resistor (e.g., providing the slave ODRR 250b) to receive the updated first signal RCODE'. Configuring each input/output bank may also include, at 525b, providing a first driver (e.g., the driver 350) having a first pull-up circuit (e.g., the first PU circuit 350a) coupled to a first pull-down circuit (e.g., the first PD circuit 350b) through a first intermediate node (e.g., the node D).

Configuring each input/output bank may also include, at 525c, coupling the first intermediate node D to the slave ODRR 250b, and at 525d, providing a second comparator (e.g., the second comparator 360) to compare a voltage (e.g., $V_D$) at the first intermediate node D with a second programmable reference voltage (e.g., Vref_TxPcal) to generate a second comparison result (e.g., CR2). Configuring each input/output bank may also include, at 525e, configuring a second state machine (e.g., the second state machine 235b) to generate an initial second signal PCODE to the first pull-up circuit 350a.

Configuring each input/output bank may also include, at 525f, further configuring the second state machine 235b to update the initial second signal PCODE, in response to the second comparison result CR2, to calibrate an output impedance of the first pull-up circuit 350a against a calibrated output impedance of the slave ODRR 250b.

Configuring each input/output bank may also include (not shown), providing a second driver (e.g., the driver 375) having a second pull-up circuit (e.g., the second PU circuit 375a) coupled to a second pull-down circuit (e.g., the second PD circuit 375b) through a second intermediate node (e.g., the node G), and coupling the second pull-up circuit and the second pull-down circuit to the second state machine. Configuring each input/output bank may also include providing a third comparator (e.g., the third comparator 380) to compare a voltage (e.g., $V_G$) at the second intermediate node G with a third programmable reference voltage (e.g., Vref_TxNcal) to generate a third comparison result (e.g., CR3). Configuring each input/output bank may also include, configuring the second state machine (e.g., the second state machine 235b) to generate an initial second signal NCODE to the second pull-down circuit 350a and provide the calibrated PCODE (e.g., the PCODE') to the second pull-up circuit. The initial NCODE may be then updated in response to the third comparison result CR3. Thus, the calibrated NCODE (e.g., NCODE') may be obtained. Accordingly, each bank may be calibrated independently once the RCODE' is received from the master reference circuit 220a/ the first state machine 235a. Instead of having a dedicated reference resistor pin in every bank, this impedance calibration circuit 220 provides a design to only use one reference resistor pin per device such that useable IO pin counts may be maximized.

Figure 6:
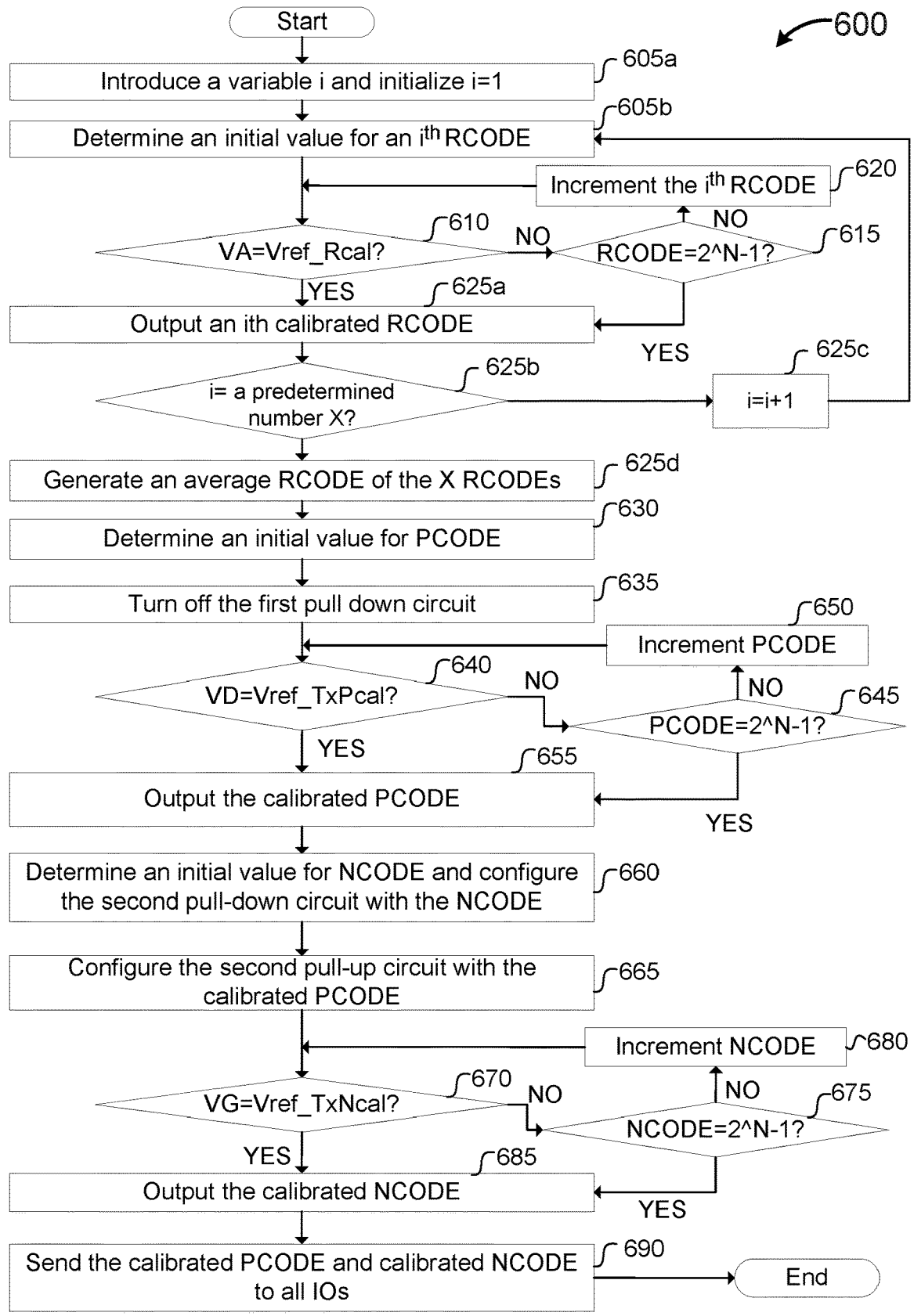
FIG. 6 depicts a flow chart of an exemplary method of calibrating the driver output impedance.

FIG. 6 depicts a flow chart of an exemplary method of calibrating the driver output impedance. An exemplary method 600 to calibrate the driver output impedance. includes, at 605a, introducing a variable i and initializing the variable i to 1. The method 600 also includes, at 605b, determining (e.g., by the first state machine 235a) an initial value for an $i^{th}$ RCODE. The exemplary method 600 also includes, at 610, determining whether $V_A$ is equal to Vref_Rcal. If $V_A$ is not equal to Vref_Rcal, then, at 615, checking whether RCODE is saturated (e.g., whether RCODE reaches its maximum value of $2^N-1$). If RCODE is not saturated, then, at 620, the exemplary method 600 includes incrementing the $i^{th}$ RCODE, and the method 600 loops back to 610. If $i^{th}$ RCODE is saturated, then, at 625a, the method 600 includes outputting the corresponding $i^{th}$ RCODE. If $V_A$ is equal to Vref_Rcal, then, at 625a, the method 600 also includes outputting the corresponding $i^{th}$ RCODE which enables $V_A$ to equal to Vref_Rcal. The method 600 also includes, at 625b, determining whether i is equal to a predetermined number X (e.g., X=8). If i is not equal to X, then, the method 600 includes, at 625c, incrementing I, and the method 600 loops back to 605b. If i=X, then, the method 600 includes, at 625d, calculating an average of the X ROCODEs (e.g., $1^{st}$ RCODE, ... $X^{th}$ RCODE) as the calibrated RCODE (e.g., RCODE').

The exemplary method 600 also includes, at 630, determining an initial value (e.g., by the second state machine 235b) for PCODE and, at 635, turning off the first pull-down circuit 350b. In some embodiments, the first pull-down circuit 350b may be always off. The exemplary method 600 also includes, at 640, determining whether $V_D$ is equal to Vref_TxPcal. If $V_D$ is not equal to Vref_TxPcal, then, at 645, checking whether PCODE is saturated (e.g., whether PCODE reaches its maximum value of $2^N-1$). If PCODE is not saturated, then, at 650, the exemplary method 600 includes incrementing the PCODE and loops back to 640. If PCODE is saturated, then, the exemplary method 600 also includes outputting the corresponding PCODE as the calibrated PCODE (e.g., PCODE') at 655. If $V_D$ is equal to Vref_TxPcal, then, at 655, the method 600 also includes outputting the corresponding PCODE which enables $V_D$ to equal Vref_TxPcal as the calibrated PCODE (e.g., PCODE').

The exemplary method 600 also includes, at 660, determining an initial value (e.g., by the second state machine 235b) for NCODE and, at 665, configuring the second pull-up circuit with PCODE'. The exemplary method 600 also includes, at 670, determining whether $V_G$ is equal to Vref_TxNcal. If $V_G$ is not equal to Vref_TxNcal, then, at 675, checking whether NCODE is saturated (e.g., whether NCODE reaches its maximum value of $2^N-1$). If NCODE is not saturated, then, at 680, the exemplary method 600 includes incrementing the NCODE and loops back to 670. If NCODE is saturated, then, the exemplary method 600 also includes outputting the corresponding NCODE as the calibrated NCODE (e.g., NCODE') at 685. If $V_G$ is equal to Vref_TxNcal, then, at 685, the method 600 also includes outputting the corresponding NCODE which enables $V_G$ to equal Vref_TxCcal as the calibrated NCODE (e.g., NCODE'). The method also includes, at 695, sending the calibrated NCODE and the calibrated PCODE (e.g., the NCODE' and the PCODE') to all IOs.

In some embodiments, the first state machine 235a may also be configured to continuously monitor the change (e.g., power, voltage, current, temperature) in the chip. The RCODE' may be then updated and the updated RCODE' may be sent to the TX pull-up impedance calibration circuit 220b and the TX pull-down impedance calibration circuit 220c for PCODE'/NCODE' calibration. If there is a change, then the method 600 loops back to 610 to recalibrate the RCODE, PCODE, and NCODE. In some embodiments, the calibration sequence of the PCODE and NCODE may be switched. In some embodiments, the calibrated RCODE, PCODE, and NCODE (e.g., the RCODE', PCODE', NCODE') may be scaled before sending to banks and IOs.

In this depicted example, the impedance calibration circuit 220 is arranged on the same integrated circuit (e.g., the DDR4 interface 240) with the IO 205. Although, as an example, the impedance calibration circuit 220 and related methods are discussed to explain the output impedance calibration of the IO 205, in some embodiments, the impedance calibration circuit 220 may be used to calibrate a termination impedance of a receiver.

In some embodiments, the impedance calibration circuit 220 may be implemented as hard block fixed circuitry. For example, an application specific integrated circuit (ASIC) may provide an impedance calibration circuit to perform the TX output impedance/RX termination impedance calibration with customized hardware circuitry.

In some embodiments, some or all of the functions of the impedance calibration circuit 220 (e.g., the first and second state machines) may be implemented in a processor that is configured to execute a set of instructions stored in a data store to control the generation of the RCODE, RCODE', PCODE, PCODE', NCODE, and/or NCODE'. The processor may be arranged on the same integrated circuit, which may be an FPGA, with the IO 205 and/or the receiver 210. For example, the digital portion of the impedance calibration circuit 220 and the data store may be implemented in a programmable logic block of a system-on-chip (SOC) or implemented in a hard block using fixed circuitry of the SOC, and the transmitter 202/receiver 210 may be implemented in another hard block using, for example, fixed circuitry of the SOC.

Figure 7:
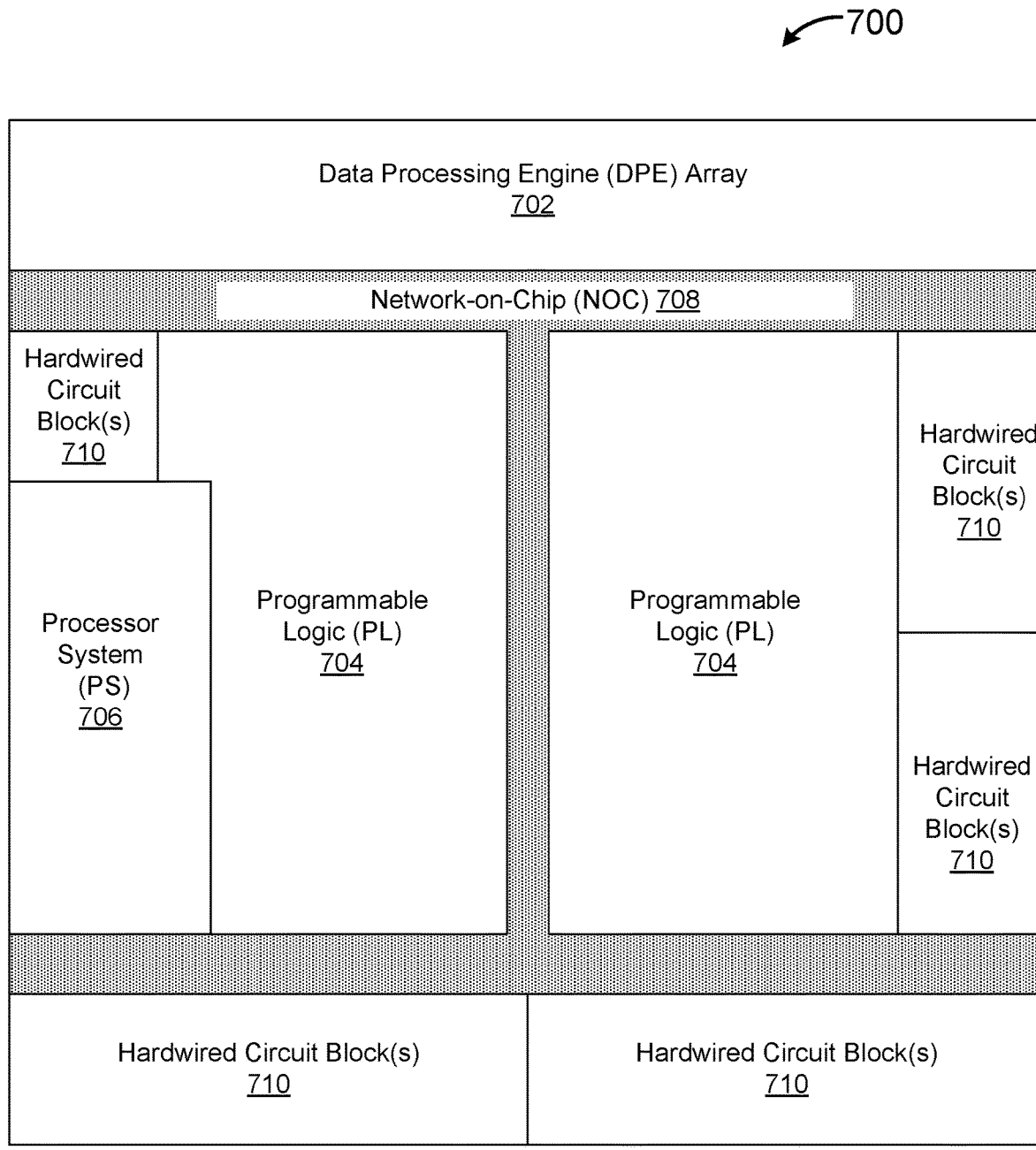
FIG. 7 illustrates another exemplary System-on-Chip (SOC) on which the disclosed circuits and processes may be implemented.

FIG. 7 illustrates an exemplary architecture of a System-on-Chip (SOC) on which the disclosed circuits and processes may be implemented. SOC 700 is an example of a programmable IC and an integrated programmable device platform. In the example of FIG. 7, the various, different subsystems or regions of the SOC 700 illustrated may be implemented on a single die provided within a single integrated package. In other examples, the different subsystems may be implemented on a plurality of interconnected dies provided as a single, integrated package.

In the example, the SOC 700 includes a plurality of regions having circuitry with different functionalities. In the example, the SOC 700 optionally includes a data processing engine (DPE) array 702. SOC 700 includes programmable logic (PL) regions 704 (hereafter PL region(s) or PL), a processing system (PS) 706, a Network-on-Chip (NOC) 708, and one or more hardwired circuit blocks 710. DPE array 702 is implemented as a plurality of interconnected, hardwired, and programmable processors having an interface to the other regions of the SOC 700.

PL 704 is circuitry that may be programmed to perform specified functions. As an example, PL 704 may be implemented as field programmable gate array type of circuitry. PL 704 can include an array of programmable circuit blocks. Examples of programmable circuit blocks within PL 704 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within PL 704 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 706 is implemented as hardwired circuitry that is fabricated as part of the SOC 700. The PS 706 may be implemented as, or include, any of a variety of different processor types each capable of executing program code. For example, PS 706 may be implemented as an individual processor, e.g., a single core capable of executing program code. In another example, PS 706 may be implemented as a multicore processor. In still another example, PS 706 may include one or more cores, modules, co-processors, interfaces, and/or other resources. PS 706 may be implemented using any of a variety of different types of architectures. Example architectures that may be used to implement PS 706 may include, but are not limited to, an ARM processor architecture, an x86 processor architecture, a GPU architecture, a mobile processor architecture, a DSP architecture, or other suitable architecture that is capable of executing computer-readable instructions or program code.

NOC 708 includes an interconnecting network for sharing data between endpoint circuits in SOC 700. The endpoint circuits can be disposed in DPE array 702, PL regions 704, PS 706, and/or in hardwired circuit blocks 710. NOC 708 can include high-speed data paths with dedicated switching. In an example, NOC 708 includes horizontal paths, vertical paths, or both horizontal and vertical paths. The arrangement and number of regions shown in FIG. 7 is merely an example. The NOC 708 is an example of the common infrastructure that is available within the SOC 700 to connect selected components and/or subsystems.

NOC 708 provides connectivity to PL 704, PS 706, and to selected ones of the hardwired circuit blocks 710. NOC 708 is programmable. In the case of a programmable NOC used with other programmable circuitry, the nets that are to be routed through NOC 708 are unknown until a user circuit design is created for implementation within the SOC 700. NOC 708 may be programmed by loading configuration data into internal configuration registers that define how elements within NOC 708 such as switches and interfaces are configured and operate to pass data from switch to switch and among the NOC interfaces.

NOC 708 is fabricated as part of the SOC 700 and while not physically modifiable, may be programmed to establish connectivity between different master circuits and different slave circuits of a user circuit design. NOC 708, for example, may include a plurality of programmable switches that are capable of establishing packet switched network connecting user specified master circuits and slave circuits. In this regard, NOC 708 is capable of adapting to different circuit designs, where each different circuit design has different combinations of master circuits and slave circuits implemented at different locations in the SOC 700 that may be coupled by NOC 708. NOC 708 may be programmed to route data, e.g., application data and/or configuration data, among the master and slave circuits of the user circuit design. For example, NOC 708 may be programmed to couple different user-specified circuitry implemented within PL 704 with PS 706, and/or DPE array 702, with different hardwired circuit blocks, and/or with different circuits and/or systems external to the SOC 700.

The hardwired circuit blocks 710 may include input/output (IO) blocks, and/or transceivers for sending and receiving signals to circuits and/or systems external to SOC 700, memory controllers, or the like. Examples of different IO blocks may include single-ended and pseudo differential IOs and high-speed differentially clocked transceivers. Further, the hardwired circuit blocks 710 may be implemented to perform specific functions. Examples of hardwired circuit blocks 710 include, but are not limited to, cryptographic engines, digital-to-analog converters, analog-to-digital converters, and the like. The hardwired circuit blocks 710 within the SOC 700 may be referred to herein from time-to-time as application-specific blocks.

In the example of FIG. 7, PL 704 is shown in two separate regions. In another example, PL 704 may be implemented as a unified region of programmable circuitry. In still another example, PL 704 may be implemented as more than two different regions of programmable circuitry. The particular organization of PL 704 is not intended as a limitation. In this regard, SOC 700 includes one or more PL regions 704, PS 706, and NOC 708. DPE array 702 may be optionally included.

In other example implementations, the SOC 700 may include two or more DPE arrays 702 located in different regions of the IC. In still other examples, the SOC 700 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Although various embodiments may be implemented using reconfigurable programmable logic blocks (e.g., FPGA), other embodiments may be implemented in fixed instantiations (e.g., ASIC), or combined in a single integrated circuit (e.g., SOC) with programmable logic. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

Although various embodiments have been described with reference to the figures, other embodiments are possible. For example, in some embodiments, the calibration technique may be used when the resistor calibration is needed on-chip.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. An impedance calibration system for an input/output circuit, the system comprising:
   (a) a master resistance coupled to an input node, wherein the master resistance is configured to adjust its resistance value in response to a feedback signal;
   (b) an input port adapted to connect the input node to an input signal from an external precision resistor;
   (c) a control circuit adapted to (c1) generate the feedback signal based on a comparison of the input signal to a predetermined threshold signal, and (c2) generate a calibration code corresponding to the feedback signal; and,
   (d) an impedance calibration circuit having a slave resistance coupled to receive the generated calibration code, wherein:
   the slave resistance is configured;
     as a replica of the master resistance, and
     to receive the generated calibration code, and
   the slave resistance determines an impedance of at least one driver in the impedance calibration circuit, the at least one driver coupled to the slave resistance via a first intermediate node.

2. The system of claim 1, wherein the master resistance comprises an on-die pull-down resistor.

3. The system of claim 2, wherein the on-die pull-down resistor comprises a plurality of on-die pull-down resistors connected in parallel.

4. The system of claim 3, wherein each sub on-die pull-down resistor comprises a poly resistor coupled to a drain terminal of a transistor.

5. The system of claim 4, wherein the poly resistor is a tunable n-bit poly resistor.

6. The system of claim 5, wherein the control circuit comprises:
- a first comparator configured to compare a voltage at the input node with the predetermined threshold signal to generate a first comparison result; and,
- a first state machine configured to generate an initial first signal and update the initial first signal, in response to the first comparison result, to calibrate an impedance of the master resistance according to the external precision resistor.

7. The system of claim 6, wherein first state machine is configured to start a calibration cycle by modulating an n-bit code of the master resistance and looking for a step change on the first comparison result.

8. The system of claim 6, wherein first state machine is configured to conduct for a predetermined number of iterations and generate an average of the predetermined number of iterations to obtain the feedback signal.

9. The system of claim 6, wherein first state machine is further configured to scale the generated calibration code with a predetermined coefficient.

10. The system of claim 1, further comprising:
- a plurality of N input/output banks, wherein each input/output bank of the plurality of N input/output banks comprises a first circuit, wherein the first circuit comprises:
  - a first driver, having a first pull-up circuit coupled to a first pull-down circuit through the first intermediate node;
  - a second comparator configured to compare a voltage at the first intermediate node with a second programmable reference voltage to generate a second comparison result; and,
  - a second state machine configured to generate an initial second signal to the first pull-up circuit, and update the initial second signal, in response to the second comparison result, to calibrate an impedance of the first pull-up circuit according to the calibrated slave resistance.

11. The system of claim 10, wherein each input/output bank of the plurality of N input/output banks further comprises a second circuit, and the second circuit comprises:
- a second driver, having a second pull-up circuit coupled to a second pull-down circuit through a second intermediate node, wherein the second pull-up circuit is configured to receive the updated second signal; and,
- a third comparator configured to compare a voltage at the second intermediate node with a third programmable reference voltage to generate a third comparison result, wherein the second state machine is further configured to generate an initial third signal to the second pull-down circuit, and update the initial third signal, in response to the third comparison result, to calibrate an impedance of the second pull-down circuit against the calibrated impedance of the first pull-up circuit.

12. The system of claim 11, wherein the second state machine is further configured to turn off the first pull-down circuit while calibrating the impedance of the second pull-down circuit.

13. The system of claim 11, wherein the first pull-down circuit is coupled to circuit ground.

14. The system of claim 11, wherein each of the first driver and the second driver is a replica of a driver in a transmission circuit.

15. The system of claim 11, wherein each of the first driver and the second driver is a replica of a driver in a receiving circuit.

16. A method of implementing an impedance calibration system for an input/output circuit, the method comprising:
- (a) providing a master resistance and coupling the master resistance to an input node configured to adjust its resistance value in response to a feedback signal;
- (b) adapting an input port to connect the input node to an input signal from an external precision resistor;
- (c) providing a control circuit and configuring the control circuit to (c1) generate the feedback signal based on a comparison of the input signal to a predetermined threshold signal, and (c2) generate a calibration code corresponding to the feedback signal; and,
- (d) providing an impedance calibration circuit having a slave resistance, and coupling the slave resistance to receive the generated calibration code and determine an impedance of at least one driver in the impedance calibration circuit, the at least one driver coupled to the slave resistance via a first intermediate node, wherein:
the slave resistance is configured;
as a replica of the master resistance, and
to receive the generated calibration code.

17. The method of claim 16, wherein the master resistance comprises a plurality of on-die pull-down resistors connected in parallel.

18. The method of claim 17, wherein each sub on-die pull-down resistor comprises a poly resistor coupled to a drain terminal of a transistor.

19. The method of claim 18, wherein the poly resistor is a tunable n-bit poly resistor.

20. The method of claim 19, further comprising:
providing a plurality of N input/output banks, and configuring each input/output bank of the plurality of N input/output banks to have a first circuit, wherein configuring each input/output bank comprises:
- providing the slave resistance to receive the generated calibration code;
- providing a first driver having a first pull-up circuit coupled to a first pull-down circuit through a first intermediate node;
- providing a comparator to compare a voltage at the first intermediate node with a second programmable reference voltage to generate a comparison result;
- configuring a state machine to generate an initial second signal to the first pull-up circuit; and,
- further configuring the state machine to update the initial second signal, in response to the comparison result, to calibrate an impedance of the first pull-up circuit against the calibrated slave resistance.

* * * * *